US 6,618,284 B2

(12) United States Patent
Shimada et al.

(10) Patent No.: US 6,618,284 B2
(45) Date of Patent: Sep. 9, 2003

(54) SEMICONDUCTOR MEMORY AND METHOD FOR DRIVING THE SAME

(75) Inventors: Yasuhiro Shimada, Kyoto (JP); Yoshihisa Kato, Shiga (JP); Takayoshi Yamada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/011,489

(22) Filed: Dec. 11, 2001

(65) Prior Publication Data

US 2002/0141224 A1 Oct. 3, 2002

(30) Foreign Application Priority Data

Mar. 30, 2001 (JP) ........................................ 2001-098685

(51) Int. Cl.$^7$ .............................................. G11C 11/22
(52) U.S. Cl. ........................................ 365/145; 365/171
(58) Field of Search .................................. 965/145, 171

(56) References Cited

U.S. PATENT DOCUMENTS

| 5,559,733 A | | 9/1996 | McMillan et al. ........... 365/145 |
| 5,740,100 A | * | 4/1998 | Yoo ............................ 365/145 |
| 5,966,318 A | * | 10/1999 | Ramer et al. ................ 365/145 |

FOREIGN PATENT DOCUMENTS

EP  1 126 525  8/2001

OTHER PUBLICATIONS

European Search Report, Application No. 02001522.8–2210, Dated: Jul. 2, 2002.

* cited by examiner

Primary Examiner—M. Tran
(74) Attorney, Agent, or Firm—Nixon Peabody LLP; Donald R. Studebaker

(57) ABSTRACT

A semiconductor memory includes a ferroelectric capacitor having a ferroelectric film, a first electrode formed on the ferroelectric film and a second electrode formed under the ferroelectric film. A data writing unit causes a first state in which the ferroelectric film has polarization in a direction from the first electrode to the second electrode or in a direction from the second electrode to the first electrode and has a substantially saturated polarization value or a second state in which the ferroelectric film has polarization in the same direction as in the first state and has a substantially zero polarization value, thereby writing a data corresponding to the first state or the second state in the ferroelectric capacitor. A data reading unit detects whether the ferroelectric capacitor is in the first state or in the second state, thereby reading a data stored in the ferroelectric capacitor.

18 Claims, 9 Drawing Sheets

SEMICONDUCTOR MEMORY AND METHOD FOR DRIVING THE SAME

BACKGROUND OF THE INVENTION

The present invention relates to a semiconductor memory including a ferroelectric capacitor and a method for driving the same.

A semiconductor memory including a ferroelectric capacitor is expected to work as a nonvolatile memory capable of providing a limitless read number.

A conventional semiconductor memory including a ferroelectric capacitor will now be described with reference to FIG. 8.

As shown in FIG. 8, a source region 2 and a drain region 3 are formed in surface portions of a silicon substrate 1. On a region of the silicon substrate 1 sandwiched between the source region 2 and the drain region 3, a silicon oxide film 4, a ferroelectric film 5 of a metal oxide such as lead zirconate titanate (PZT) or bismuth tantalate strontium (SBT) and a gate electrode 6 are successively formed, so as to together form a ferroelectric FET.

In this structure, the polarization direction of the ferroelectric film 5 can be set to the upward direction or the downward direction, and the depth of surface potential of a region of the silicon substrate 1 below the gate electrode 6 can be set to two different states respectively corresponding to the two polarization states (namely, the upward polarization and the downward polarization). Since the depth of the surface potential corresponds to the resistance between the source and the drain of the ferroelectric FET, the resistance between the source and the drain is set to either a high value or a low value depending upon the polarization direction of the ferroelectric film 5. Since the upward polarization or the downward polarization is kept (stored) as far as the polarization of the ferroelectric film 5 is kept, the ferroelectric FET can be used as a nonvolatile memory.

In the ferroelectric FET having this structure, a state where the ferroelectric film 5 has the downward polarization is allowed to correspond to, for example, a data "1" and a state where it has the upward polarization is allowed to correspond to a data "0". For example, when a ground potential is applied to the lower face of the silicon substrate 1 with a large positive voltage applied to the gate electrode 6, the polarization of the ferroelectric film 5 can be set to the downward polarization. Alternatively, when a ground potential is applied to the lower face of the silicon substrate 1 with a large negative voltage applied to the gate electrode 6, the polarization of the ferroelectric film 5 can be set to the upward polarization. After setting the polarization of the ferroelectric film 5 to the downward or upward polarization, the potential of the gate electrode 6 is restored to the ground potential.

FIGS. 9A, 9B and 9C are energy band diagrams obtained when the silicon substrate 1 has p-type conductivity and the source region 2 and the drain region 3 have n-type conductivity. FIG. 9A shows the energy band obtained when the polarization is downward (namely, a data "1" is stored), FIG. 9B shows the energy band obtained when the polarization is upward (namely, a data "0" is stored) and FIG. 9C shows the thermal equilibrium energy state. In FIGS. 9A through 9C, a reference numeral 11 denotes the conduction band of the gate electrode 6, a reference numeral 12 denotes the energy band of the ferroelectric film 5, a reference numeral 13 denotes the energy band of the silicon oxide film 4, a reference numeral 14 denotes the energy band of the silicon substrate 1 and a reference numeral 15 denotes the energy band of a depletion layer formed in the vicinity of the surface of the silicon substrate 1. Also, a void arrow denotes the polarization direction of the ferroelectric film 5.

In the case of the downward polarization (corresponding to a data "1"), the negatively ionized depletion layer 15 extends to a deep region of the silicon substrate 1 as shown in FIG. 9A, and hence, the surface potential of the silicon substrate 1 becomes lower than the ground potential.

In the case of the upward polarization (corresponding to a data "0"), no depletion layer is formed in the silicon substrate 1 because holes, that is, p-type carriers, are stored on the surface of silicon substrate 1 as shown in FIG. 9B, and hence, the surface potential of the silicon substrate 1 accords with the ground potential.

Since the surface potential of the region of the silicon substrate 1 below the gate electrode 6 thus depends upon the polarization direction, when a potential difference is caused between the drain and the source, a current flowing between the drain and the source is different depending upon the polarization direction. Specifically, when the surface potential of the silicon substrate 1 is lower than the ground potential (namely, when a data "1" is stored), the resistance between the drain and the source is low (namely, the FET is in an ON state), and hence, a large current flows between the drain and the source. On the other hand, when the surface potential of the silicon substrate 1 accords with the ground potential (namely, when a data "0" is stored), the resistance between the drain and the source is high (namely, the FET is in an OFF state), and hence, substantially no current flows between the drain and the source. When a current value between the drain and the source is detected, it can be found whether the ferroelectric FET is in the state corresponding to a data "1" or in the state corresponding to a data "0".

Since whether the ferroelectric FET is in the state corresponding to a data "1" or in the state corresponding to a data "0" can be thus found, the polarization of the ferroelectric film 5 is not reversed in reading a data from the ferroelectric FET. Thus, what is called a non-destructive read-out system is realized. In other words, there is no need to carry out an operation for recovering the direction or the magnitude of the polarization, namely, a rewrite operation, after data read.

In this manner, a ferroelectric FET is capable of a non-destructive read operation, and therefore, a problem of polarization fatigue of a ferroelectric film, which is caused in a destructive read operation accompanying polarization reversal, can be avoided. Accordingly, the ferroelectric FET is expected to work as a nonvolatile memory capable of providing a limitless read number.

However, the ferroelectric film 5 of the ferroelectric FET is generally a semiconductor having a large number of defective levels, and hence, electrons and holes can easily move within the ferroelectric film 5.

Therefore, when the ferroelectric FET is in an ON state as shown in FIG. 9A, since electrons are injected from the conduction band 11 of the gate electrode 6 into the ferroelectric film 5, charge at the head of the polarization is neutralized and hence the bottom of the potential in a V shape is gradually elevated, resulting in the thermal equilibrium energy state shown in FIG. 9C.

On the other hand, when the ferroelectric FET is in an OFF state as shown in FIG. 9B, since holes are injected from the conduction band 11 of the gate electrode 6 into the ferroelectric film 5, charge at the head of the polarization is neutralized and hence the apex of the potential in a reverse V shape is gradually lowered, also resulting in the thermal equilibrium energy state shown in FIG. 9C.

As a result, since the surface potential of the silicon substrate 1 becomes the same level in spite of the different polarization directions, namely, the upward polarization and the downward polarization, it is difficult to distinguish the two states depending upon a current flowing between the drain and the source.

This problem can be explained by using a hysteresis curve 20 of the ferroelectric capacitor and a gate capacitance load line 21 of the ferroelectric FET drawn on a polarization—voltage (Q-V) plane shown in FIG. 10. The structure of the ferroelectric FET of FIG. 8 can be regarded as a series circuit of the ferroelectric capacitor and a metal—oxide film—silicon (MOS) capacitor when a virtual electrode is disposed between the ferroelectric film 5 and the silicon oxide film 4.

In this series circuit, in the case of the downward polarization (namely, the state of storing a data "1" corresponding to the energy band diagram of FIG. 8A), the polarization is positioned in a point 22 immediately after data write, and a negative bias voltage corresponding to a distance from the origin O to the point 22 is applied to the ferroelectric film 5. This bias voltage causes electron injection into the ferroelectric film 5, and therefore, the polarization moves from the point 22 to the origin O.

On the other hand, in the case of the upward polarization (namely, the state of storing a data "0" corresponding to the energy band diagram of FIG. 8B), the polarization is positioned in a point 23 immediately after data write, and a positive bias voltage corresponding to a distance from the origin O to the point 23 is applied to the ferroelectric film 5. This bias voltage causes hole injection into the ferroelectric film 5, and therefore, the polarization moves from the point 23 to the origin O.

Thus, in the conventional ferroelectric FET, a difference between a data "1" and a data "0" is distinguished by using a potential difference induced between the ferroelectric film 5 and the silicon oxide film 4 depending upon the polarization direction. However, the potential difference induced between the ferroelectric film 5 and the silicon oxide film 4 works as a driving force for injecting electrons or holes for eliminating the induced potential difference. In other words, there is a problem that the voltage is unavoidably eliminated through the electron or hole injection into the ferroelectric film 5.

SUMMARY OF THE INVENTION

In consideration of the aforementioned conventional problems, an object of the invention is reading a data stored in a ferroelectric capacitor even when a potential difference caused in the ferroelectric capacitor is eliminated through electron or hole injection.

In order to achieve the object, the first semiconductor memory of this invention comprises a ferroelectric capacitor formed on a semiconductor substrate and including a ferroelectric film, a first electrode formed on the ferroelectric film and a second electrode formed under the ferroelectric film; data writing means for causing a first state in which the ferroelectric film has polarization in a direction from the first electrode to the second electrode or in a direction from the second electrode to the first electrode and has a substantially saturated polarization value or causing a second state in which the ferroelectric film has polarization in the same direction as in the first state and has a substantially zero polarization value, whereby writing a data corresponding to the first state or the second state in the ferroelectric capacitor; and data reading means for reading a data stored in the ferroelectric capacitor by detecting whether the ferroelectric capacitor is in the first state or in the second state.

In the first semiconductor memory, two different states of the ferroelectric capacitor storing different data (such as a data "1" and a data "0") are distinguished from each other by the two states in which the polarization of the ferroelectric film is in the same direction, namely, the first state in which the ferroelectric film has the substantially saturated polarization value (corresponding to, for example, a data "1") and the second state in which the ferroelectric film has the substantially zero polarization value (corresponding to, for example, a data "0"). Accordingly, even when a potential difference caused in the ferroelectric capacitor is eliminated through electron or hole injection, a data stored in the ferroelectric capacitor can be read.

In the first semiconductor memory, the data writing means preferably causes the first state or the second state in the ferroelectric capacitor by applying a voltage between a first signal line connected to the first electrode and a second signal line connected to the second electrode.

Thus, an operation for writing a data "1" or a data "0" in the ferroelectric capacitor by causing the first state or the second state in the ferroelectric capacitor can be easily and directly carried out.

In the first semiconductor memory, the data reading means preferably includes means for generating, between the first electrode and the second electrode, a voltage for inducing, in the ferroelectric film, an electric field in the same direction as the direction of the polarization of the ferroelectric film.

Thus, the direction of the polarization of the ferroelectric film is not changed even when a reading voltage is applied to the ferroelectric capacitor, and therefore, the ferroelectric capacitor can keep on storing a data. As a result, the polarization fatigue of the ferroelectric film can be reduced.

In the first semiconductor memory, the data reading means preferably includes a load capacitor serially connected to the ferroelectric capacitor and means for applying a reading voltage to both ends of a series circuit composed of the ferroelectric capacitor and the load capacitor, and detects whether the ferroelectric capacitor is in the first state or in the second state by detecting a voltage induced in the load capacitor resulting from dividing the reading voltage in accordance with a ratio between capacitance of the ferroelectric capacitor and capacitance of the load capacitor.

Thus, a read operation can be eased because a data stored in the ferroelectric capacitor can be read by detecting the voltage induced in the load capacitor in applying the reading voltage to the both ends of the series circuit of the ferroelectric capacitor and the load capacitor.

In the first semiconductor memory, the data reading means preferably includes a field effect transistor formed on the semiconductor substrate and connected to the second electrode at a gate electrode thereof and means for applying a reading voltage between the first electrode and the semiconductor substrate or a source electrode of the field effect transistor, and detects whether the ferroelectric capacitor is in the first state or in the second state by detecting a change of channel conductance of the field effect transistor caused by a voltage induced in the gate electrode resulting from dividing the reading voltage in accordance with a ratio between capacitance of the ferroelectric capacitor and gate capacitance of the field effect transistor.

Thus, a read operation can be eased because change of the voltage induced in the gate electrode of the field effect transistor in applying the reading voltage between the first electrode and the semiconductor substrate or the source electrode of the field effect transistor can be detected as change of the channel conductance of the field effect transistor.

In the first semiconductor memory, the data reading means can include a bit line connected to the second electrode and means for applying a reading voltage between the first electrode and the bit line, and detect whether the ferroelectric capacitor is in the first state or in the second state by detecting a voltage induced in the bit line resulting from dividing the reading voltage in accordance with a ratio between capacitance of the ferroelectric capacitor and capacitance of the bit line.

The second semiconductor memory of this invention comprises a memory cell block of a plurality of successively connected memory cells each including a ferroelectric capacitor having a ferroelectric film, a first electrode formed on the ferroelectric film and a second electrode formed under the ferroelectric film and a cell selecting transistor serially connected to the ferroelectric capacitor; data writing means for causing a first state in which the ferroelectric film of a selected ferroelectric capacitor selected by the cell selecting transistor from the plurality of ferroelectric capacitors has polarization in a direction from the first electrode to the second electrode or in a direction from the second electrode to the first electrode and has a substantially saturated polarization value or causing a second state in which the ferroelectric film of the selected ferroelectric capacitor has polarization in the same direction as in the first state and has a substantially zero polarization value by applying a writing voltage between a control line connected to a first common node out of two common nodes included in the memory cell block and a second common node out of the two common nodes, whereby writing a data corresponding to the first state or the second state in the selected ferroelectric capacitor; and data reading means, including a load capacitor connected to the first common node and means for applying a reading voltage between the second common node and the load capacitor, for detecting whether a selected ferroelectric capacitor selected by the cell selecting transistor from the plurality of ferroelectric capacitors is in the first state or in the second state by detecting a voltage induced in the load capacitor resulting from dividing the reading voltage in accordance with a ratio between capacitance of the selected ferroelectric capacitor and capacitance of the load capacitor, whereby reading a data stored in the selected ferroelectric capacitor.

In the second semiconductor memory, two different states of the ferroelectric capacitor storing different data (such as a data "1" and a data "0") are distinguished from each other by the two states in which the polarization of the ferroelectric film is in the same direction, namely, the first state in which the ferroelectric film has the substantially saturated polarization value (corresponding to, for example, a data "1") and the second state in which the ferroelectric film has the substantially zero polarization value (corresponding to, for example, a data "0"). Accordingly, it is possible to realize a memory cell array in which a data stored in the ferroelectric capacitor can be read even when a potential difference caused in the ferroelectric capacitor is eliminated through electron or hole injection.

The first method for driving a semiconductor memory of this invention comprises the steps of writing a data in a ferroelectric capacitor formed on a semiconductor substrate and including a ferroelectric film, a first electrode formed on the ferroelectric film and a second electrode formed under the ferroelectric film; and reading a data stored in the ferroelectric capacitor, and the step of writing a data includes a sub-step of causing a first state in which the ferroelectric film has polarization in a direction from the first electrode to the second electrode or in a direction from the second electrode to the first electrode and has a substantially saturated polarization value or causing a second state in which the ferroelectric film has polarization in the same direction as in the first state and has a substantially zero polarization value, whereby writing a data corresponding to the first state or the second state in the ferroelectric capacitor, and the step of reading a data includes a sub-step of detecting whether the ferroelectric capacitor is in the first state or in the second state, whereby reading a data stored in the ferroelectric capacitor.

In the first method for driving a semiconductor memory, two different states of the ferroelectric capacitor storing different data (such as a data "1" and a data "0") are distinguished from each other by the two states in which the polarization of the ferroelectric film is in the same direction, namely, the first state in which the ferroelectric film has the substantially saturated polarization value (corresponding to, for example, a data "1") and the second state in which the ferroelectric film has the substantially zero polarization value (corresponding to, for example, a data "0"). Accordingly, even when a potential difference caused in the ferroelectric capacitor is eliminated through electron or hole injection, a data stored in the ferroelectric capacitor can be read, and polarization fatigue of the ferroelectric film can be reduced.

In the first method for driving a semiconductor memory, the step of writing a data preferably includes a sub-step of causing the first state or the second state in the ferroelectric capacitor by applying a voltage between a first signal line connected to the first electrode and a second signal line connected to the second electrode.

Thus, an operation for writing a data "1" or a data "0" in the ferroelectric capacitor by causing the first state or the second state in the ferroelectric capacitor can be easily and directly carried out.

In the first method for driving a semiconductor memory, the step of reading a data preferably includes a sub-step of reading a data stored in the ferroelectric capacitor by detecting whether the ferroelectric capacitor is in the first state or in the second state after setting a potential of the second signal line to a ground potential and placing the second electrode in a floating state by disconnecting the second electrode from the second signal line.

When the potential of the second signal line is thus once set to the ground potential, the potential of the second electrode can be defined. Therefore, unnecessary charge stored in the second electrode during a write operation or a read operation conducted before this read operation can be removed. Furthermore, when the reading voltage is applied after placing the second electrode in the floating state by disconnecting the second electrode from the second signal line, it can be definitely detected whether the ferroelectric capacitor is in the first state or in the second state.

In the first method for driving a semiconductor memory, the step of reading a data preferably includes a sub-step of generating, between the first electrode and the second electrode, a voltage for inducing, in the ferroelectric film, an electric field in the same direction as the direction of the polarization of the ferroelectric film.

Thus, the direction of the polarization of the ferroelectric film is not changed even when the reading voltage is applied to the ferroelectric capacitor, and hence, the ferroelectric capacitor can keep on storing a data.

In the first method for driving a semiconductor memory, the step of reading a data preferably includes a sub-step of applying a reading voltage to both ends of a series circuit composed of the ferroelectric capacitor and a load capacitor serially connected to the ferroelectric capacitor, and detecting a voltage induced in the load capacitor resulting from dividing the reading voltage in accordance with a ratio between capacitance of the ferroelectric capacitor and capacitance of the load capacitor, whereby detecting whether the ferroelectric capacitor is in the first state or in the second state.

Thus, a read operation can be eased because a data stored in the ferroelectric capacitor can be read by detecting the voltage induced in the load capacitor in applying the reading voltage to the both ends of the series circuit of the ferroelectric capacitor and the load capacitor.

In the first method for driving a semiconductor memory, the step of reading a data preferably includes a sub-step of applying a reading voltage between the first electrode and the semiconductor substrate or a source electrode of a field effect transistor formed on the semiconductor substrate and connected to the second electrode at a gate electrode thereof, and detecting change of channel conductance of the field effect transistor caused by a voltage induced in the gate electrode resulting from dividing the reading voltage in accordance with a ratio between capacitance of the ferroelectric capacitor and gate capacitance of the field effect transistor, whereby detecting whether the ferroelectric capacitor is in the first state or in the second state.

Thus, a read operation can be easily and definitely carried out because the voltage induced in the gate electrode of the field effect transistor in applying the reading voltage between the first electrode and the semiconductor substrate or the source electrode of the field effect transistor can be detected by detecting change of the channel conductance of the field effect transistor.

In the first method for driving a semiconductor memory, the step of reading a data can include a sub-step of applying a reading voltage between the first electrode and a bit line connected to the second electrode, and detecting a voltage induced in the bit line resulting from dividing the reading voltage in accordance with a ratio between capacitance of the ferroelectric capacitor and capacitance of the bit line, whereby detecting whether the ferroelectric capacitor is in the first state or in the second state.

The first method for driving a semiconductor memory preferably further comprises, at least in the case where the ferroelectric capacitor is in the second state, a step of setting a potential of the second electrode to a ground potential after removing the reading voltage applied to the first electrode in the step of reading a data.

Thus, the polarization of the ferroelectric film is restored to the state before data read, and therefore, even when the ferroelectric capacitor is in the second state, the data read operation can be repeatedly carried out.

The second method for driving a semiconductor memory of this invention comprises the steps of writing, in a memory cell block of a plurality of successively connected memory cells each including a ferroelectric capacitor having a ferroelectric film, a first electrode formed on the ferroelectric film and a second electrode formed under the ferroelectric film and a cell selecting transistor serially connected to the ferroelectric capacitor, a data in a selected ferroelectric capacitor selected by the cell selecting transistor from the plurality of ferroelectric capacitors; and reading a data stored in a selected ferroelectric capacitor selected by the cell selecting transistor from the plurality of ferroelectric capacitors, and the step of writing a data includes a sub-step of applying a writing voltage between a control line connected to a first common node out of two common nodes included in the memory cell block and a second common node out of the two common nodes, and causing a first state in which the ferroelectric film of the selected ferroelectric capacitor has polarization in a direction from the first electrode to the second electrode or in a direction from the second electrode to the first electrode and has a substantially saturated polarization value or causing a second state in which the ferroelectric film of the selected ferroelectric capacitor has polarization in the same direction as in the first state and has a substantially zero polarization value, whereby writing a data corresponding to the first state or the second state in the selected ferroelectric capacitor, and the step of reading a data includes a sub-step of applying a reading voltage between the second common node and a load capacitor connected to the first common node, and detecting whether the selected ferroelectric capacitor is in the first state or in the second state by detecting a voltage induced in the load capacitor resulting from dividing the reading voltage in accordance with a ratio between capacitance of the selected ferroelectric capacitor and capacitance of the load capacitor, whereby reading a data stored in the selected ferroelectric capacitor.

In the second method for driving a semiconductor memory, two different states of the ferroelectric capacitor storing different data (such as a data "1" and a data "0") are distinguished from each other by the two states in which the polarization of the ferroelectric film is in the same direction, namely, the first state in which the ferroelectric film has the substantially saturated polarization value (corresponding to, for example, a data "1") and the second state in which the ferroelectric film has the substantially zero polarization value (corresponding to, for example, a data "0"). Accordingly, even when a potential difference caused in the selected ferroelectric capacitor is eliminated through electron or hole injection, a data stored in the ferroelectric capacitor selected in a memory cell array can be read.

DETAILED DESCRIPTION OF THE INVENTION

EMBODIMENT 1

A semiconductor memory and a method for driving the same according to Embodiment 1 of the invention will now be described with reference to FIGS. 1 through 5.

Figure 1:
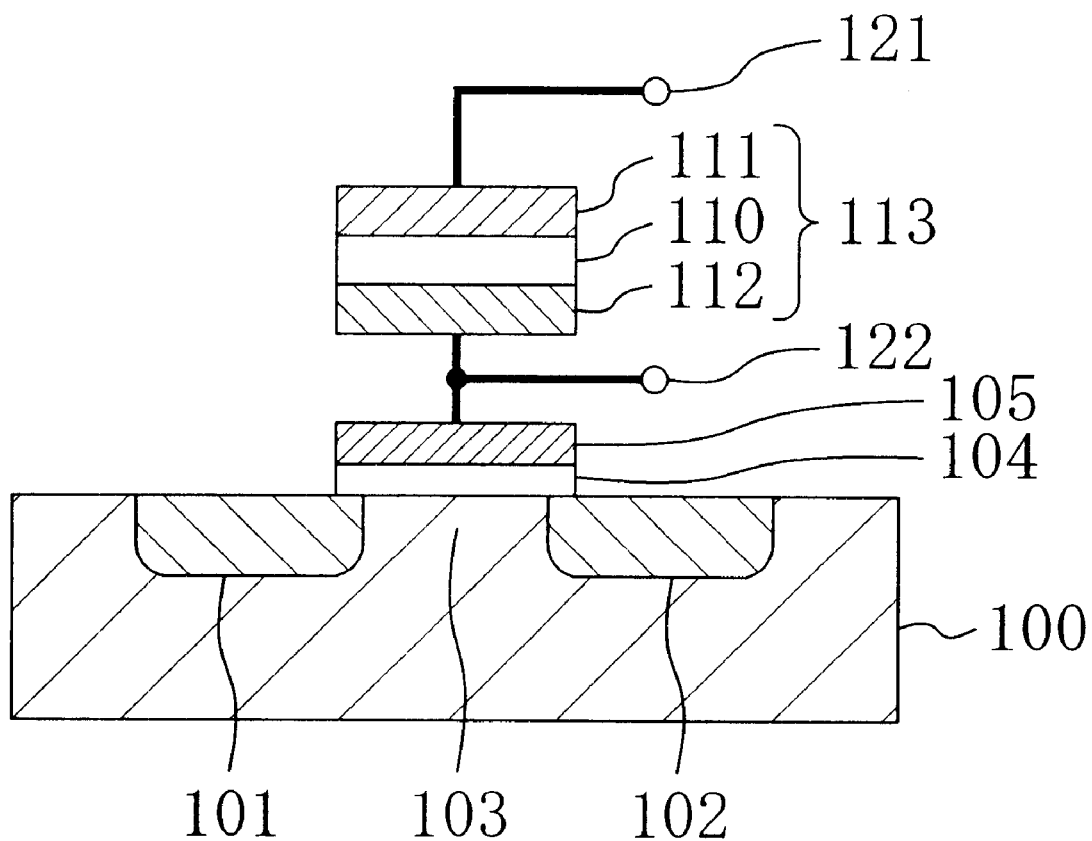
FIG. 1 is a cross-sectional view of a semiconductor memory according to Embodiment 1 of the invention.

FIG. 1 shows the cross-sectional structure of the semiconductor memory of Embodiment 1. In surface portions of, for example, a p-type silicon substrate 100, a source region 101 and a drain region 102 of n-type impurity layers are formed, and a channel region 103 is formed in a surface portion of the silicon substrate 100 sandwiched between the source region 101 and the drain region 102. On a region of the silicon substrate 100 between the source region 101 and the drain region 102, a floating gate electrode 105 is disposed with a gate insulating film 104 of a silicon oxide film sandwiched therebetween. The source region 101, the drain region 102, the channel region 103, the gate insulating film 104 and the floating gate electrode 105 together form a field effect transistor (hereinafter referred to as the FET).

A ferroelectric capacitor 113 is disposed above the floating gate electrode 105 with an insulating film not shown sandwiched therebetween, and the ferroelectric capacitor 113 includes a ferroelectric film 110, a first electrode 111 formed on the ferroelectric film 110 and a second electrode 112 formed under the ferroelectric film 110. The first electrode 111 is connected to a first signal line 121, and the second electrode 112 and the floating gate electrode 105 are connected to a second signal line 122. In other words, the second electrode 112 and the floating gate electrode 105 are connected to each other through the second signal line 122. The ferroelectric film 110 is made from, for example, SBT and has a thickness of, for example, 200 nm. In this case, the coercive voltage of the ferroelectric film 110 is approximately 1 V.

As characteristics of the semiconductor memory of Embodiment 1, a voltage for changing the polarization of the ferroelectric film 110 can be directly applied between the first signal line 121 and the second signal line 122 in a data write operation, and the potential of the floating gate electrode 105 can be defined by using the second signal line 122 before a data read operation.

(Data Write Operation)

In the semiconductor memory of Embodiment 1, a data write operation is carried out by causing a first state (corresponding to, for example, a data "1") in which the ferroelectric film 110 has polarization in a direction from the first electrode 111 to the second electrode 112 (namely, downward direction) or in a direction from the second electrode 112 to the first electrode 111 (namely, upward direction) and has a substantially saturated polarization value, or by causing a second state (corresponding to, for example, a data "0") in which the ferroelectric film 110 has polarization in the same direction as in the first state and has a substantially zero polarization value. In other words, the state corresponding to a data "1" and the state corresponding to a data "0" are distinguished from each other by the two states in which the polarization direction is the same but the polarization values are different.

Figure 2:
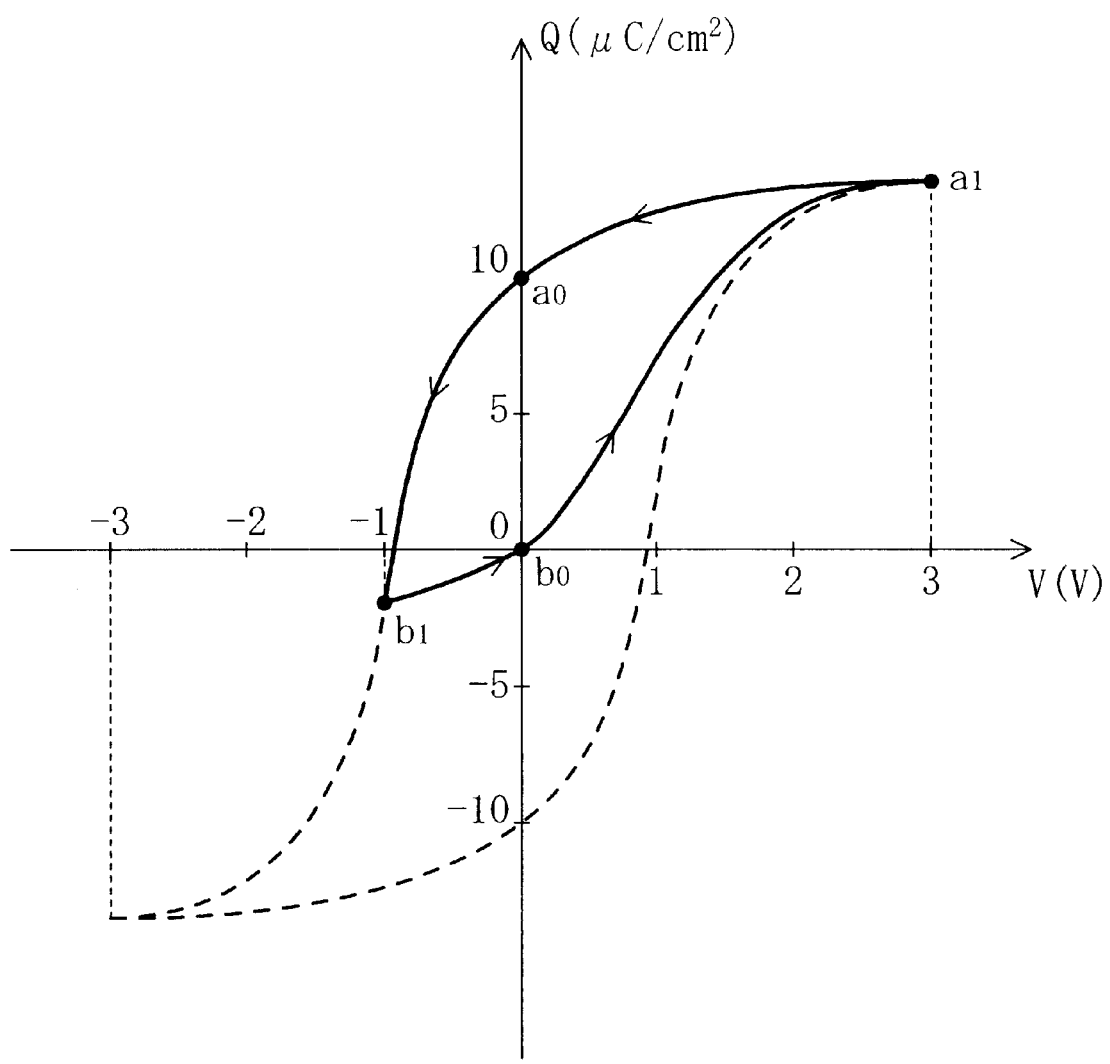
FIG. 2 is a diagram for showing the relationship between the potential of a first electrode and the polarization of a ferroelectric film in writing a data "1" or a data "0" in the semiconductor memory of Embodiment 1.

A specific example of the data write operation will now be described with reference to a hysteresis curve drawn on a Q-V plane of FIG. 2. In FIG. 2, a solid line denotes a hysteresis curve of the ferroelectric film 110 of the semiconductor memory of Embodiment 1, and a broken line denotes a hysteresis curve of the ferroelectric film 5 of the conventional ferroelectric FET.

It is assumed, in the following description, that the potential of the silicon substrate 100 is always the ground potential and that a polarization value obtained in the downward polarization is positive.

In the semiconductor memory of Embodiment 1, the polarization value of the ferroelectric film 110 obtained before writing a data is substantially zero, and hence, the polarization is positioned in the vicinity of the origin O.

In writing a data "1" in the ferroelectric film 110, for example, the potential of the second signal line 122 is set to the ground potential and the potential of the first signal line 121 is set to 3 V. Thus, the polarization of the ferroelectric film 110 moves along the solid line from the origin O to a point $a_1$. Thereafter, when the potential of the first signal line 121 is restored to the ground potential, the polarization moves along the solid line from the point $a_1$ to a point $a_0$, and the ferroelectric film 110 stores charge of approximately 10 $\mu C/cm^2$ as a data "1".

In rewriting a data "1" to a data "0", with the potential of the second signal line 122 set to the ground potential, the potential of the first signal line 121 is set to approximately −1 V. Thus, the polarization of the ferroelectric film 110 moves along the solid line from the point $a_0$ to a point $b_1$. Thereafter, when the potential of the first signal line 121 is restored to the ground potential, the polarization moves along the solid line from the point $b_1$ to a point $b_0$. The point $b_0$ is a point having a positive value and positioned in the vicinity of the origin O. Thus, the ferroelectric film 110 stores charge having a positive value of approximately 0 $\mu C/cm^2$ as a data "0".

Alternatively, in writing a data "0", the potential of the first signal line 121 may be set to the ground potential with the potential of the second signal line 122 set to 1 V instead of setting the potential of the second signal line 122 to the ground potential with the potential of the first signal line 121 set to approximately −1 V.

In Embodiment 1, there is no need to set the potential of the second signal line 122 to the ground potential and the potential of the first signal line 121 to −3 V for writing a data "0". The reason is the state where the charge obtained by the polarization has a positive value of approximately 0 $\mu C/cm^2$ is defined as a data "0" in this invention, and therefore, the polarization value obtained in writing a data "0" can be approximately 0 $\mu C/cm^2$.

(Data Read Operation)

In the semiconductor memory of Embodiment 1, a data read operation is carried out by detecting whether the FET is in the first state (for example, corresponding to the state of storing a data "1") in which the ferroelectric film 110 has the substantially saturated polarization value or it is in the second state (for example, corresponding to the state of storing a data "0") in which the ferroelectric film 110 has the substantially zero polarization value.

A specific example of the data read operation will now be described.

First, the potential of the second signal line 122 is set to the ground potential, so as to define the potential of the floating gate electrode 105. This procedure is carried out for the purpose of removing unnecessary charge stored in the floating gate electrode 105 during a write operation and a read operation conducted before this read operation.

Next, the second signal line 122 is disconnected from the peripheral circuit, and a predetermined reading voltage $V_R$ is applied to the first signal line 121. The reading voltage $V_R$ is divided, in accordance with a ratio between the capacitance of the ferroelectric capacitor 113 and the gate capacitance of the FET, into a voltage applied to the ferroelectric film 110 and a voltage applied to the gate insulating film 105.

Figure 3:
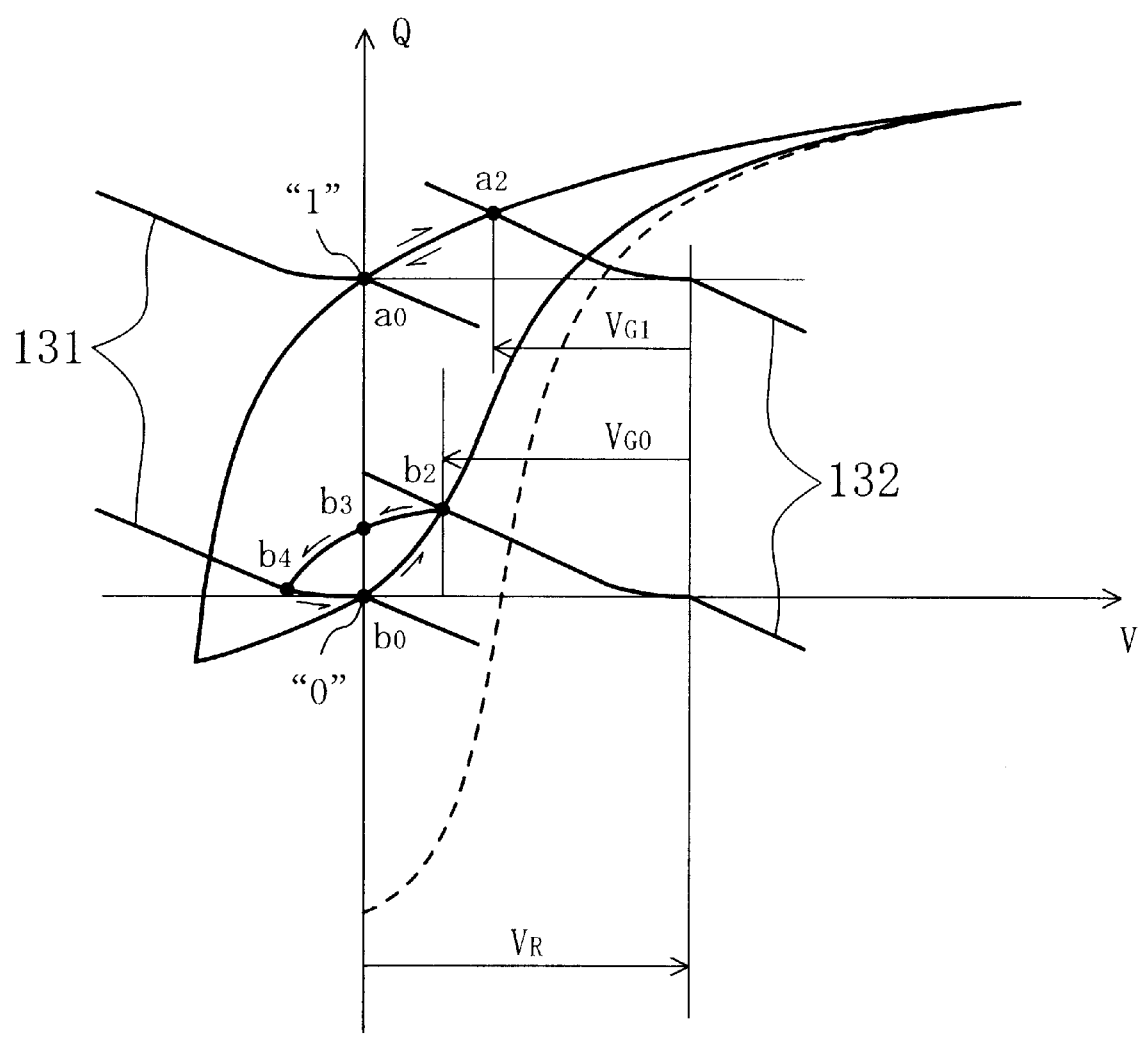
FIG. 3 is a diagram for showing the relationship between the potential of a floating gate electrode and the polarization of the ferroelectric film in reading a data "1" or a data "0" from the semiconductor memory of Embodiment 1.

This operation will now be described with reference to FIG. 3. In FIG. 3, a reference numeral 131 denotes a first load line corresponding to the gate capacitance of the FET obtained when the potential of the first electrode 111 is 0 V, and a reference numeral 132 denotes a second load line corresponding to the gate capacitance of the FET obtained when the potential of the first electrode 111 is the voltage $V_R$ (of approximately 2 V).

In the case where the ferroelectric film 110 has the large polarization value (in the case of storing a data "1"), a potential represented by $V_{G1}$ of FIG. 3 is generated in the floating gate electrode 105 when seen from the silicon substrate 100. In this case, the direction of an electric field applied to the ferroelectric film 110 accords with the polarization direction obtained in storing a data "1", and the polarization moves from a point $a_0$ to a point $a_2$. Since the polarization value is substantially saturated, the direction and the magnitude of the polarization are not different from those obtained before the read operation even when the reading voltage $V_R$ is removed.

On the other hand, when the ferroelectric film 110 has he small polarization value (in the case of storing a data "0"), a potential represented by $V_{G0}$ of FIG. 3 is generated in the floating gate electrode 105 when seen from the silicon substrate 100. Also in this case, the direction of an electric field applied to the ferroelectric film 110 accords with the polarization direction obtained in storing a data "0", and the polarization moves from a point $b_0$ to a point $b_2$.

In the case where the ferroelectric film 110 has the small polarization value (in the case of storing a data "0"), if the data read operation is repeated, the polarization value is gradually increased, so as to reduce the difference in the polarization value between a data "1" and a data "0", and ultimately data cannot be distinguished.

Therefore, the reading voltage $V_R$ is removed by grounding the first signal line 121 with the second signal line 122 opened. Thus, a potential difference reverse to the voltage $V_R$ is caused in the ferroelectric film 110, and hence, the polarization moves from the point $b_2$ to a point $b_4$ through a point $b_3$ along a small hysteresis curve. Thereafter, when the second signal line 122 is grounded, the polarization restores from the point $b_4$ to the point $b_0$, and thus, the state where the ferroelectric film 110 has the small polarization value (the state of storing a data "0") can be recovered.

Accordingly, even when a data read operation is repeated in the case where the ferroelectric film 110 has the small polarization value (the case of storing a data "0"), a data can be read.

In the voltages applied to the floating gate electrode 105 of the FET by applying the reading voltage $V_R$, there is a relationship of $V_{G0} > V_{G1}$ as is obvious from FIG. 3.

In an experiment made by the present inventors, when the reading voltage $V_R$ is 2 V with the capacitance of the ferroelectric capacitor set to approximately four times as large as the gate capacitance of the FET, a voltage of approximately 0.5 V is induced in the floating gate electrode 105, and a difference between the voltages $V_{G0}$ and $V_{G1}$ is substantially 60 mV.

In this manner, according to Embodiment 1, no matter whether a data "1" is read or a data "0" is read, the polarization is automatically restored to the original position after the read operation. Therefore, there is no need to carry out a rewrite operation after a read operation, and thus, what is called a non-destructive read operation can be realized.

Also, according to Embodiment 1, the polarization is never reversed (the polarization never becomes negative) no matter whether a data "1" is read or a data "0" is read, and therefore, the polarization fatigue can be largely reduced.

Now, the results of a test carried out for evaluating the semiconductor memory of Embodiment 1 will be described with reference to FIGS. 4 and 5.

Figure 4:
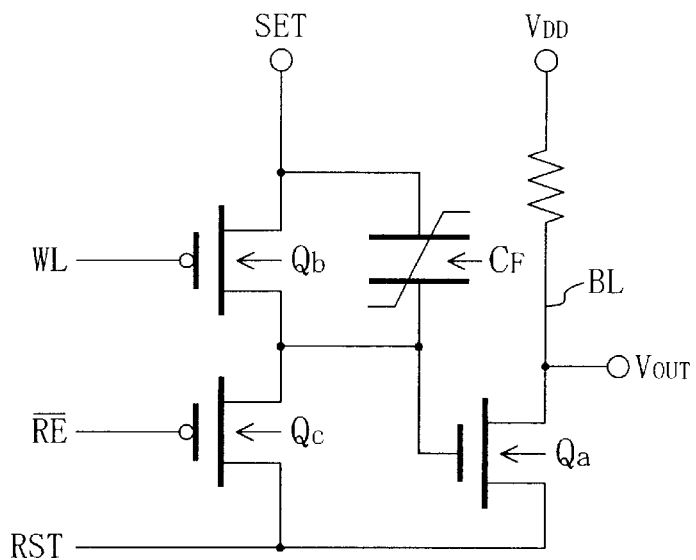
FIG. 4 is an equivalent circuit diagram of the semiconductor memory of Embodiment 1.

In an equivalent circuit of FIG. 4, a writing voltage $V_W$ (=5 V) is applied between a first electrode and a second electrode of a ferroelectric capacitor CF in writing a data "1" and a writing voltage $V_W$ (=−1 V) is applied between the first electrode and the second electrode of the ferroelectric capacitor CF in writing a data "0". Also, in reading a data, a reading voltage $V_R$ (=2.2 V) in pulse form is continuously applied to a set line SET, and an output $V_{OUT}$ of a reading field effect transistor $Q_a$ is measured.

Figure 5:
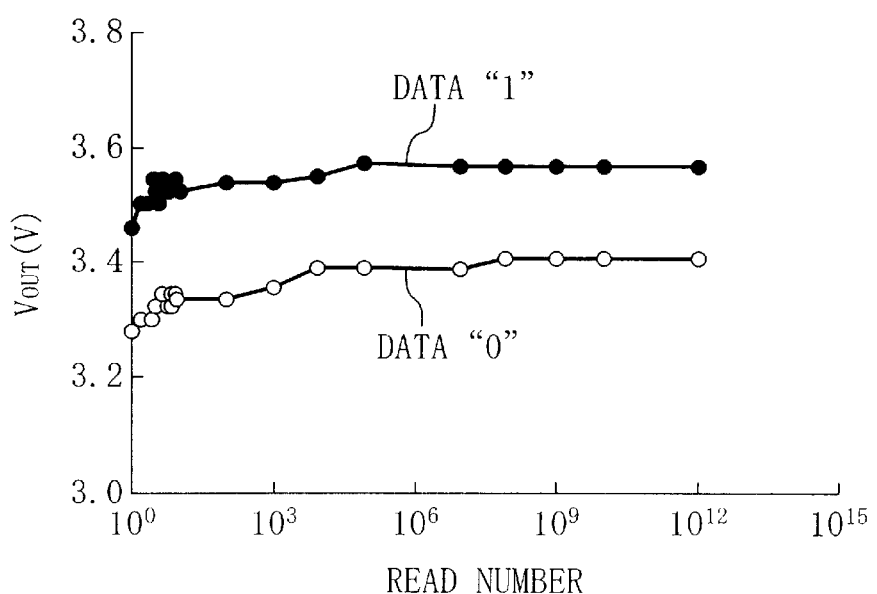
FIG. 5 is a diagram for showing the relationship between the read number and the output obtained by applying a reading voltage in pulse form to the semiconductor memory of Embodiment 1.

FIG. 5 shows the relationship between the read number and the output $V_{OUT}$ in reading data by using the equivalent circuit of FIG. 4. As is understood from FIG. 5, even when the reading voltage $V_R$ is applied $10^{12}$ times, a difference in the output level between data "1" and data "0" is minimally changed. Thus, it is proved that the difference in the output level is substantially constant, namely, the polarization fatigue is not caused.

EMBODIMENT 2

A semiconductor memory and a method for driving the same according to Embodiment 2 will now be described with reference to FIG. 6.

The semiconductor memory of Embodiment 2 comprises a memory cell block including a plurality of successively connected memory cells. The memory cells respectively include ferroelectric capacitors $CF_0$, $CF_1$, ... and $CF_n$ each having a ferroelectric film, a first electrode formed on the ferroelectric film and a second electrode formed under the ferroelectric film similarly to the ferroelectric capacitor 113 of Embodiment 1, and cell selecting transistors $Q_0$, $Q_1$, ... and $Q_n$ whose source regions are respectively connected to the second electrodes of the ferroelectric capacitors $CF_0$, $CF_1$, ... and $CF_n$.

The memory cell block further includes a first common node 201 connected to the drain regions of the cell selecting transistors $Q_0$, $Q_1$, ... and $Q_n$ at first ends thereof; a second common node 202 connected to the first electrodes of the ferroelectric capacitors $CF_0$, $CF_1$, ... and $CF_n$ at first ends thereof; a control line 203 which is connected, at the first end thereof, to a second end of the first common node 201; a reading transistor (load capacitor) 204 whose gate electrode is connected to the second end of the first common node 201; a block selecting transistor 205 whose drain region is connected to a set line SET and whose source region is connected to a second end of the second common node 202; and a reset transistor 206 whose drain region is connected to a second end of the control line 203 and whose source region is connected to a reset line RST.

Also, the gate electrodes of the cell selecting transistors $Q_0$, $Q_1$, ... and $Q_n$ are respectively connected to word lines $WL_0$, $WL_1$, ... and $WL_n$, the drain region of the reading transistor 204 is connected to the reset line RST, and the source region of the reading transistor 204 is connected to a bit line BL.

Figure 6:
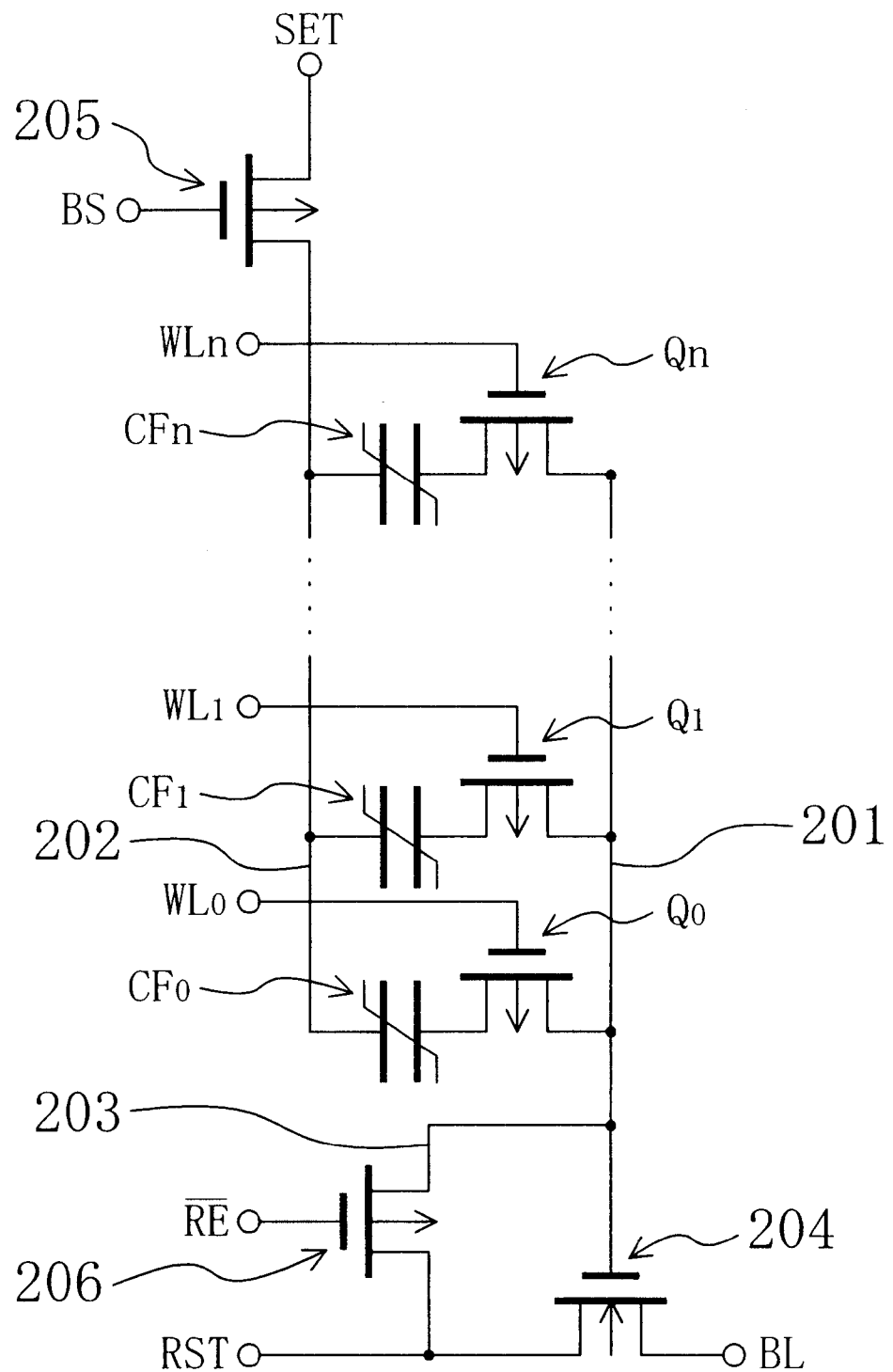
FIG. 6 is a circuit diagram for showing the configuration of a semiconductor memory according to Embodiment 2.

Although the reset line RST is connected to the source region of the reading transistor 204 in FIG. 6, the reset line RST may be connected to a semiconductor substrate where the reading transistor 204 is formed (corresponding to a portion shown with an upward arrow in FIG. 6) instead.

(Data Write Operation)

A data write operation of this semiconductor memory will now be described.

First, the block selecting transistor 205 is turned on so as to electrically connect the set line SET to the second common node 202, and the reset transistor 206 is turned on so as to electrically connect the reset line RST to the control line 203. Also, the word line connected to a memory cell selected for data write is placed in an ON state so as to turn on the cell selecting transistor included in the memory cell selected for data write.

Next, a potential difference is caused between the set line SET and the reset line RST and a writing voltage $V_{WR}$ is applied between the second common node 202 and the control line 203. Thus, the writing voltage $V_{WR}$ is directly applied between the first electrode and the second electrode of a selected ferroelectric capacitor out of the plural ferroelectric capacitors $CF_0$, $CF_1$, . . . and $CF_n$, so that the data can be written in the selected ferroelectric capacitor.

The magnitude of the writing voltage $V_{WR}$ is the same as that of Embodiment 1, and a data write operation is carried out by causing a first state (corresponding to a data "1") in which the ferroelectric film of the selected ferroelectric capacitor has polarization in a direction from the first electrode to the second electrode or in a direction from the second electrode to the first electrode and has a substantially saturated polarization value, or causing a second state (corresponding to a data "0") in which the ferroelectric film of the selected ferroelectric capacitor has polarization in the same direction as in the first state and has a substantially zero polarization value.

(Data Read Operation)

A data read operation of this semiconductor memory will now be described.

First, the block selecting transistor 205 is turned on so as to connect the set line SET to the second common node 202. Also, the reset transistor 206 is turned on so as to once ground the control line 203, and thereafter, the control line 203 is disconnected from the reset line RST by turning off the reset transistor 206 so as allow the control line 203 to have a floating potential. Furthermore, a word line connected to a memory cell selected for data read is placed in an ON state so as to turn on the cell selecting transistor included in the memory cell selected for data read.

Next, a potential difference is caused between the set line SET and the reset line RST and a reading voltage $V_R$ is applied between the second common node 202 and the reset line RST. Thus, the reading voltage $V_R$ is divided in accordance with a ratio between the capacitance of a selected ferroelectric capacitor and the gate capacitance of the reading transistor 204, and the divided voltage is applied to the gate electrode of the reading transistor 204. In other words, a voltage depending upon a data ("1" or "0") stored in the selected ferroelectric capacitor is applied to the gate electrode of the reading transistor 204. Therefore, the data stored in the selected ferroelectric capacitor can be read by detecting a current flowing between the drain and the source of the reading transistor 204, namely, channel conductance of the reading transistor 204.

According to Embodiment 2, no matter whether a data "1" is read or a data "0" is read, there is no need to carry out a rewrite operation after a read operation, and thus, what is called a non-destructive read operation can be realized.

Also, according to Embodiment 2, the polarization is never reversed (the polarization never becomes negative) after data read, and therefore, the polarization fatigue can be largely reduced.

Moreover, since the reading transistor 204 is shared by a plurality of ferroelectric capacitors, a highly integrated memory cell array with high area efficiency can be realized.

MODIFICATION OF EMBODIMENT 2

Figure 7:
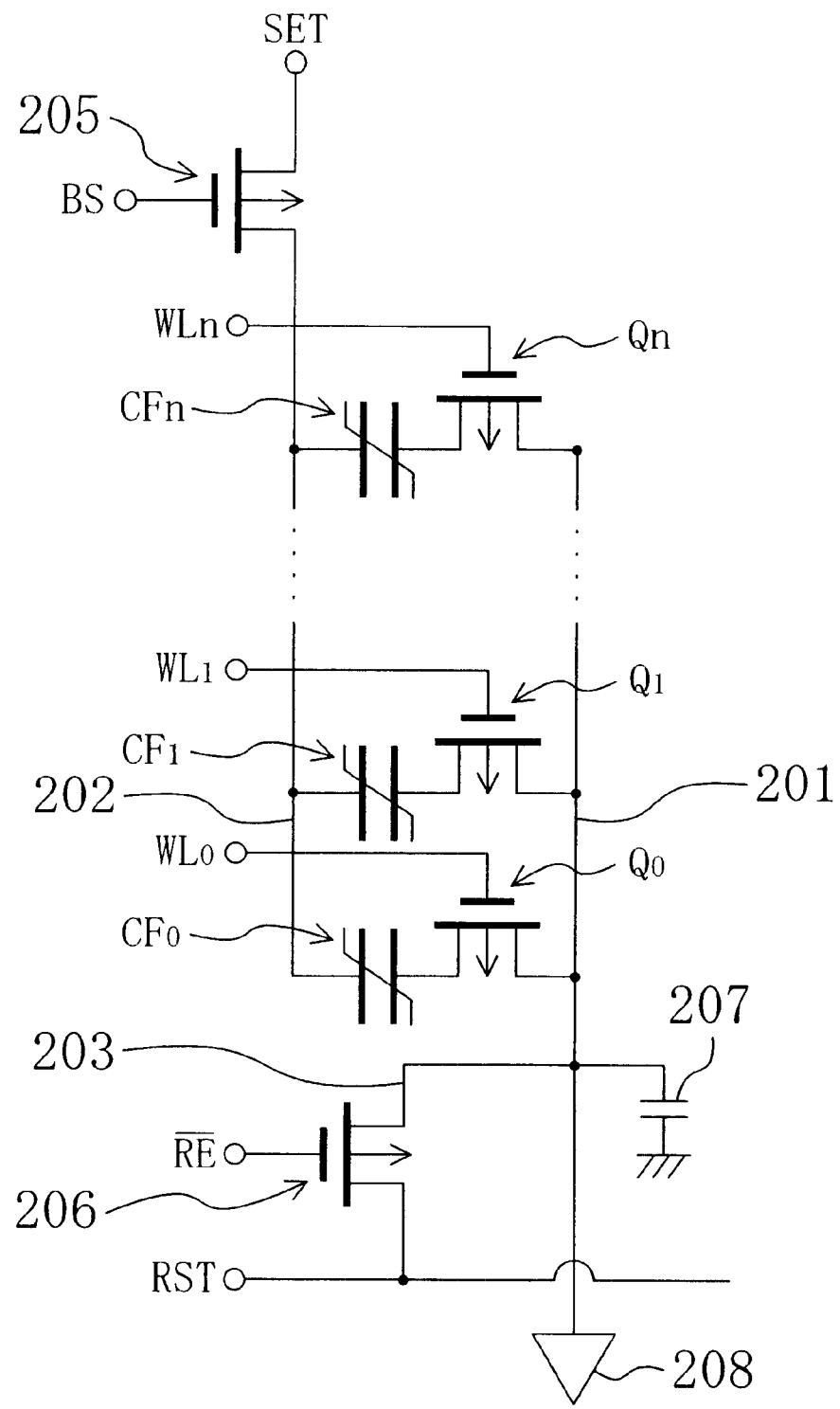
FIG. 7 is a circuit diagram for showing the configuration of a semiconductor memory according to a modification of Embodiment 2.
Figure 8:
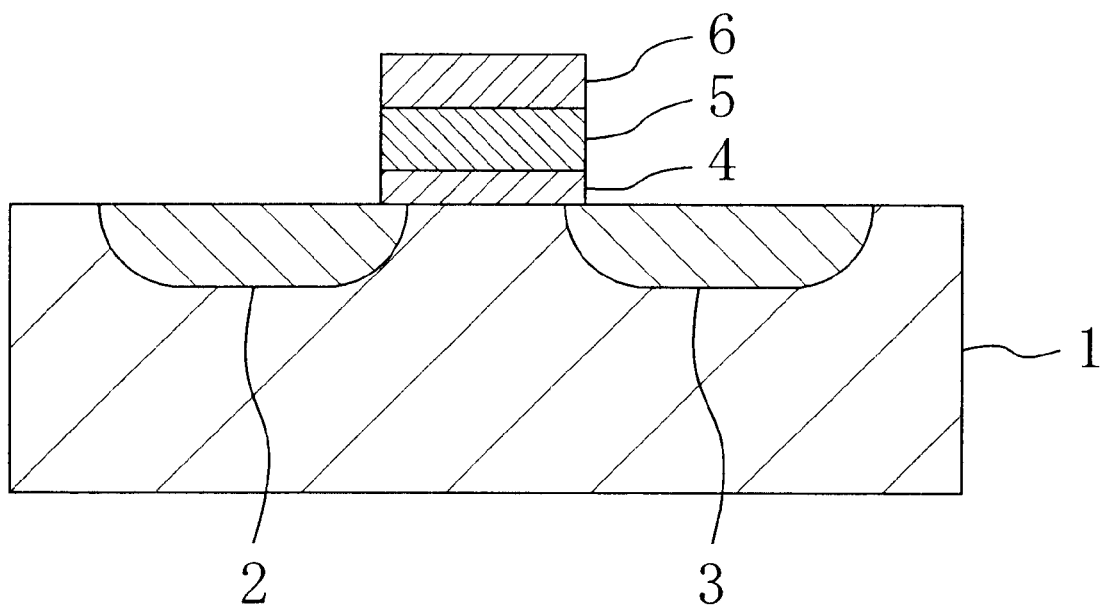
FIG. 8 is a cross-sectional view of a conventional semiconductor memory.
Figure 9A:
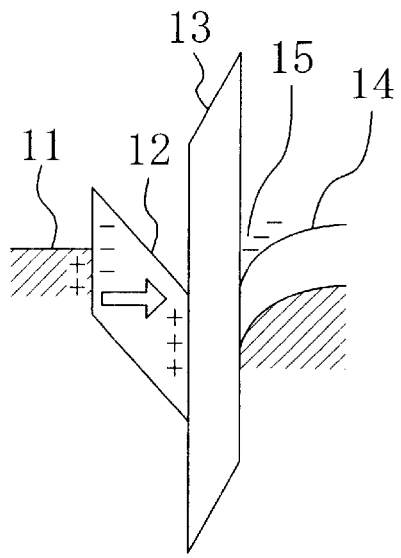
FIGS. 9A, 9B and 9C are diagrams of energy bands between a gate electrode and a silicon substrate in the conventional semiconductor memory.
Figure 9B:
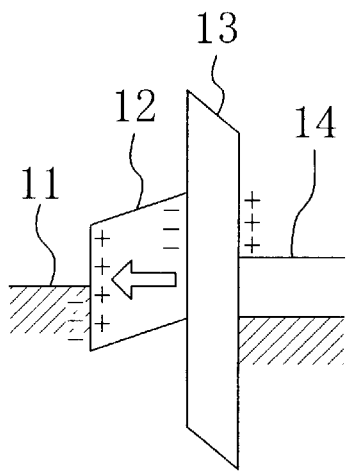
Figure 9C:
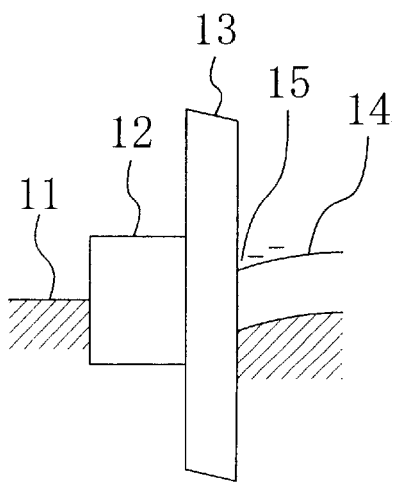
Figure 10:
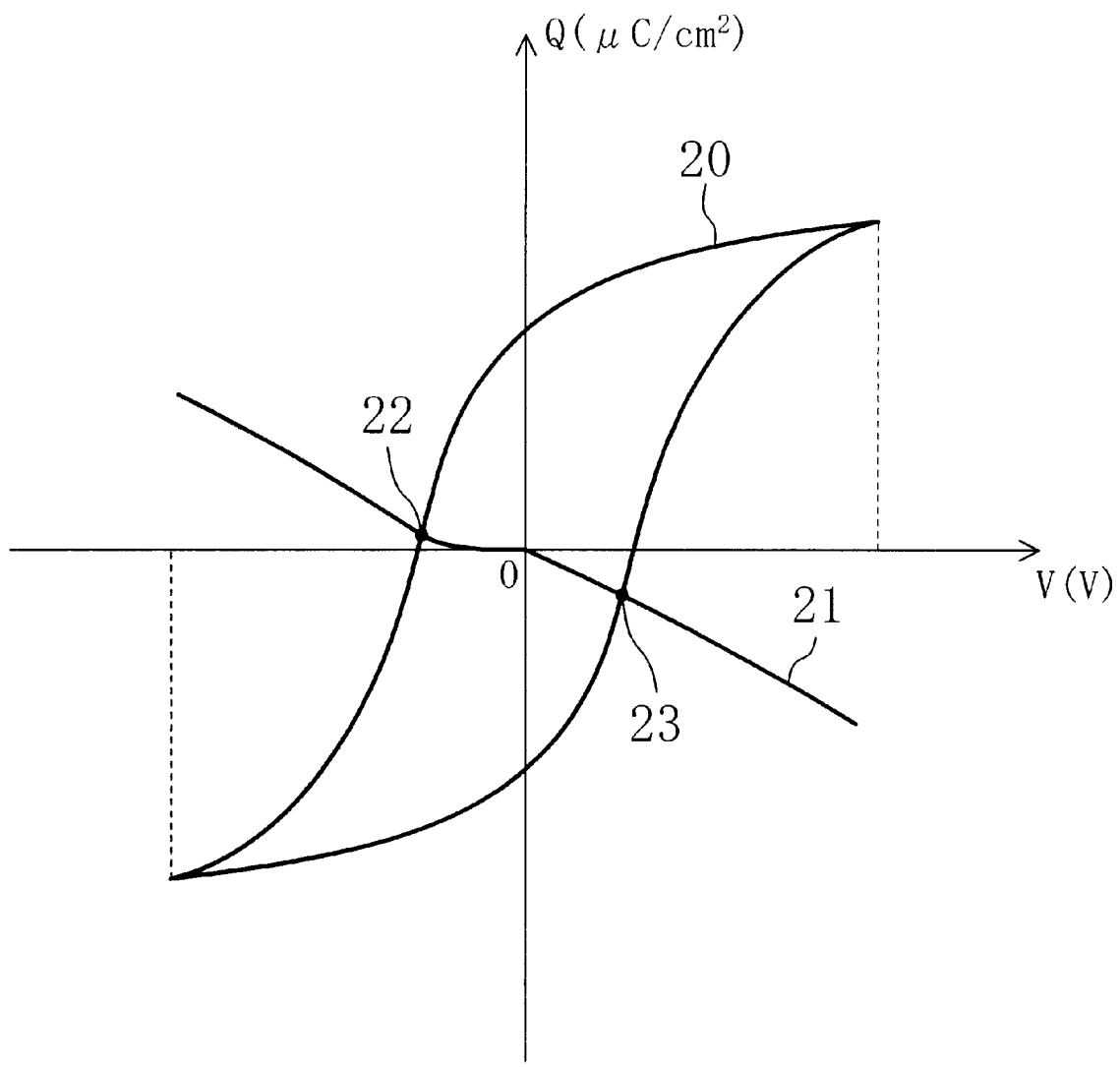
FIG. 10 is a diagram for showing the relationship between the potential of the gate electrode and the polarization of a ferroelectric film in writing a data "1" or a data "0" in the conventional semiconductor memory.

A semiconductor memory and a method for driving the same according to a modification of Embodiment 2 will now be described with reference to FIG. 7.

The modification of Embodiment 2 is basically the same as Embodiment 2 except that the first common node 201 works as a bit line and that the load capacitor connected to the second end of the first common node 201 is different from that of Embodiment 2. Therefore, the load capacitor alone will be herein described.

The first common node 201 is connected to a bit line capacitor 207, and the second end of the first common node 201 is connected to a sense amplifier 208.

In a data read operation, when a reading voltage $V_R$ is applied between the second common node 202 and the reset line RST, the reading voltage $V_R$ is divided in accordance with a ratio between the capacitance of a selected ferroelectric capacitor and the capacitance of the bit line capacitor 207, so that the divided voltage can be applied to the sense amplifier 208. Specifically, a voltage depending upon a data ("1" or "0") stored in the selected ferroelectric capacitor is detected by the sense amplifier 208, so that the data stored in the selected ferroelectric capacitor can be read.

What is claimed is:

1. A semiconductor memory comprising:

a ferroelectric capacitor formed on a semiconductor substrate and including a ferroelectric film, a first electrode formed on said ferroelectric film and a second electrode formed under said ferroelectric film;

data writing means for causing a first state in which said ferroelectric film has polarization in a direction from said first electrode to said second electrode or in a direction from said second electrode to said first electrode and has a saturated polarization value or causing a second state in which said ferroelectric film has polarization in the same direction as in said first state and has a zero polarization value, whereby writing a data corresponding to said first state or said second state in said ferroelectric capacitor; and data reading means for reading a data stored in said ferroelectric capacitor by detecting whether said ferroelectric capacitor is in said first state or in said second state, wherein said data writing means causes said first state or said second state in said ferroelectric capacitor by applying a voltage between a first signal line connected to said first electrode and a second signal line connected to said second electrode.

2. The semiconductor memory of claim 1, wherein said data reading means includes means for generating, between said first electrode and said second electrode, a voltage for inducing, in said ferroelectric film, an electric field in the same direction as the direction of the polarization of said ferroelectric film.

3. The semiconductor memory of claim 1, wherein said data reading means includes a load capacitor serially connected to said ferroelectric capacitor and means for applying a reading voltage to both ends of a series circuit composed of said ferroelectric capacitor and said load capacitor, and detects whether said ferroelectric capacitor is in said first state or in said second state by detecting a voltage induced in said load capacitor resulting from dividing said reading voltage in accordance with a ratio between capacitance of said ferroelectric capacitor and capacitance of said load capacitor.

4. The semiconductor memory of claim 1, wherein said data reading means includes a field effect transistor formed on said semiconductor substrate and connected to said second electrode at a gate electrode thereof and means for applying a reading voltage between said first electrode and said semiconductor substrate or a source electrode of said field effect transistor, and detects whether said ferroelectric capacitor is in said first state or in said second state by detecting change of channel conductance of said field effect transistor caused by a voltage induced in said gate electrode resulting from dividing said reading voltage in accordance with a ratio between capacitance of said ferroelectric capacitor and gate capacitance of said field effect transistor.

5. The semiconductor memory of claim 1, wherein said data reading means includes a bit line connected to said second electrode and means for applying a reading voltage between said first electrode and said bit line, and detects whether said ferroelectric capacitor is in said first state or in said second state by detecting a voltage induced in said bit line resulting from dividing said reading voltage in accordance with a ratio between capacitance of said ferroelectric capacitor and capacitance of said bit line.

6. A semiconductor memory comprising:

a memory cell block of a plurality of successively connected memory cells each including a ferroelectric capacitor having a ferroelectric film, a first electrode formed on said ferroelectric film and a second electrode formed under said ferroelectric film and a cell selecting transistor serially connected to said ferroelectric capacitor;

data writing means for causing a first state in which said ferroelectric film of a selected ferroelectric capacitor selected by said cell selecting transistor from said plurality of ferroelectric capacitors has polarization in a direction from said first electrode to said second electrode or in a direction from said second electrode to said first electrode and has a saturated polarization value or causing a second state in which said ferroelectric film of said selected ferroelectric capacitor has polarization in the same direction as in said first state and has a zero polarization value by applying a writing voltage between a control line connected to a first common node out of two common nodes included in said memory cell block and a second common node out of said two common nodes, whereby writing a data corresponding to said first state or said second state in said selected ferroelectric capacitor; and data reading means, including a load capacitor connected to said first common node and means for applying a reading voltage between said second common node and said load capacitor, for detecting whether a selected ferroelectric capacitor selected by said cell selecting transistor from said plurality of ferroelectric capacitors is in said first state or in said second state by detecting a voltage induced in said load capacitor resulting from dividing said reading voltage in accordance with a ratio between capacitance of said selected ferroelectric capacitor and capacitance of said load capacitor, whereby reading a data stored in said selected ferroelectric capacitor.

7. A method for driving a semiconductor memory comprising the steps of:

writing a data in a ferroelectric capacitor formed on a semiconductor substrate and including a ferroelectric film, a first electrode formed on said ferroelectric film and a second electrode formed under said ferroelectric film; and reading a data stored in said ferroelectric capacitor, wherein the step of writing a data includes a sub-step of causing a first state in which said ferroelectric film has polarization in a direction from said first electrode to said second electrode or in a direction from said second electrode to said first electrode and has a saturated polarization value or causing a second state in which said ferroelectric film has polarization in the same direction as in said first state and has a zero polarization value, whereby writing a data corresponding to said first state or said second state in said ferroelectric capacitor, and the step of reading a data includes a sub-step of detecting whether said ferroelectric capacitor is in said first state or in said second state, whereby reading a data stored in said ferroelectric capacitor.

8. The method for driving a semiconductor memory of claim 7, wherein the step of writing a data includes a sub-step of causing said first state or said second state in said ferroelectric capacitor by applying a voltage between a first signal line connected to said first electrode and a second signal line connected to said second electrode.

9. The method for driving a semiconductor memory of claim 8, wherein the step of reading a data includes a sub-step of reading a data stored in said ferroelectric capacitor by detecting whether said ferroelectric capacitor is in said first state or in said second state after setting a potential of said second signal line to a ground potential and placing said second electrode in a floating state by disconnecting said second electrode from said second signal line.

10. The method for driving a semiconductor memory of claim 7, wherein the step of reading a data includes a sub-step of generating, between said first electrode and said second electrode, a voltage for inducing, in said ferroelectric film, an electric field in the same direction as the direction of the polarization of said ferroelectric film.

11. The method for driving a semiconductor memory of claim 7, wherein the step of reading a data includes a sub-step of applying a reading voltage to both ends of a series circuit composed of said ferroelectric capacitor and a load capacitor serially connected to said ferroelectric capacitor, and detecting a voltage induced in said load capacitor resulting from dividing said reading voltage in accordance with a ratio between capacitance of said ferroelectric capacitor and capacitance of said load capacitor, whereby detecting whether said ferroelectric capacitor is in said first state or in said second state.

12. The method for driving a semiconductor memory of claim 11, further comprising, at least in the case where said ferroelectric capacitor is in said second state, a step of setting a potential of said second electrode to a ground potential after removing said reading voltage applied to said first electrode in the step of reading a data.

13. The method for driving a semiconductor memory of claim 7,
wherein the step of reading a data includes a sub-step of applying a reading voltage between said first electrode and said semiconductor substrate or a source electrode of a field effect transistor formed on said semiconductor substrate and connected to said second electrode at a gate electrode thereof, and detecting change of channel conductance of said field effect transistor caused by a voltage induced in said gate electrode resulting from dividing said reading voltage in accordance with a ratio between capacitance of said ferroelectric capacitor and gate capacitance of said field effect transistor, whereby detecting whether said ferroelectric capacitor is in said first state or in said second state.

14. The method for driving a semiconductor memory of claim 13, further comprising, at least in the case where said ferroelectric capacitor is in said second state, a step of setting a potential of said second electrode to a ground potential after removing said reading voltage applied to said first electrode in the step of reading a data.

15. The method for driving a semiconductor memory of claim 7,
wherein the step of reading a data includes a sub-step of applying a reading voltage between said first electrode and a bit line connected to said second electrode, and detecting a voltage induced in said bit line resulting from dividing said reading voltage in accordance with a ratio between capacitance of said ferroelectric capacitor and capacitance of said bit line, whereby detecting whether said ferroelectric capacitor is in said first state or in said second state.

16. The method for driving a semiconductor memory of claim 15, further comprising, at least in the case where said ferroelectric capacitor is in said second state, a step of setting a potential of said second electrode to a ground potential after removing said reading voltage applied to said first electrode in the step of reading a data.

17. A method for driving a semiconductor memory comprising the steps of:
writing, in a memory cell block of a plurality of successively connected memory cells each including a ferroelectric capacitor having a ferroelectric film, a first electrode formed on said ferroelectric film and a second electrode formed under said ferroelectric film and a cell selecting transistor serially connected to said ferroelectric capacitor, a data in a selected ferroelectric capacitor selected by said cell selecting transistor from said plurality of ferroelectric capacitors; and reading a data stored in a selected ferroelectric capacitor selected by said cell selecting transistor from said plurality of ferroelectric capacitors, wherein the step of writing a data includes a sub-step of applying a writing voltage between a control line connected to a first common node out of two common nodes included in said memory cell block and a second common node out of said two common nodes, and causing a first state in which said ferroelectric film of said selected ferroelectric capacitor has polarization in a direction from said first electrode to said second electrode or in a direction from said second electrode to said first electrode and has a saturated polarization value or causing a second state in which said ferroelectric film of said selected ferroelectric capacitor has polarization in the same direction as in said first state and has a zero polarization value, whereby writing a data corresponding to said first state or said second state in said selected ferroelectric capacitor, and the step of reading a data includes a sub-step of applying a reading voltage between said second common node and a load capacitor connected to said first common node, and detecting whether said selected ferroelectric capacitor is in said first state or in said second state by detecting a voltage induced in said load capacitor resulting from dividing said reading voltage in accordance with a ratio between capacitance of said selected ferroelectric capacitor and capacitance of said load capacitor, whereby reading a data stored in said selected ferroelectric capacitor.

18. A semiconductor memory comprising:
a ferroelectric capacitor formed on a semiconductor substrate and including a ferroelectric film, a first electrode formed on said ferroelectric film and a second electrode formed under said ferroelectric film;

data writing means for causing a first state in which said ferroelectric film has polarization in a direction from said first electrode to said second electrode or in a direction from said second electrode to said first electrode and has a saturated polarization value or causing a second state in which said ferroelectric film has polarization in the same direction as in said first state and has a different polarization value corresponding to said first state, whereby writing a data corresponding to said first state or said second state in said ferroelectric capacitor; and data reading means for reading a data stored in said ferroelectric capacitor by detecting whether said ferroelectric capacitor is in said first state or in said second state.

* * * * *